United States Patent
Gong et al.

(10) Patent No.: US 11,991,912 B2
(45) Date of Patent: May 21, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Wenliang Gong, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 791 days.

(21) Appl. No.: 17/053,186

(22) PCT Filed: Jun. 24, 2020

(86) PCT No.: PCT/CN2020/098146
§ 371 (c)(1),
(2) Date: Nov. 5, 2020

(87) PCT Pub. No.: WO2021/243770
PCT Pub. Date: Dec. 9, 2021

(65) Prior Publication Data
US 2022/0285444 A1    Sep. 8, 2022

(30) Foreign Application Priority Data
Jun. 2, 2020   (CN) .......................... 202010490533.8

(51) Int. Cl.
*H10K 59/38*   (2023.01)
*C09D 7/63*    (2018.01)
(Continued)

(52) U.S. Cl.
CPC ............... *H10K 59/38* (2023.02); *C09D 7/63* (2018.01); *C09D 101/288* (2013.01);
(Continued)

(58) Field of Classification Search
CPC ...... H10K 59/38; H10K 50/865; H10K 71/00; C09D 147/00
See application file for complete search history.

(56) References Cited

U.S. PATENT DOCUMENTS

2008/0299327 A1    12/2008  Salleo et al.
2015/0299476 A1*   10/2015  Liu ..................... G02F 1/13439
                                                        252/500
2019/0259816 A1     8/2019  Samsung Display Co Ltd

FOREIGN PATENT DOCUMENTS

CN    103861465 A    6/2014
CN    107248523 A   10/2017
(Continued)

*Primary Examiner* — Phat X Cao
(74) *Attorney, Agent, or Firm* — PV IP PC; Wei Te Chung; Zhigang Ma

(57) ABSTRACT

A display panel and a manufacturing method thereof are provided. The display panel includes a substrate, an encapsulation layer, a black matrix layer, and an oleophobic layer. The encapsulation layer is disposed on a surface of the substrate. The black matrix layer is disposed on the encapsulation layer. The black matrix layer includes a through hole. The through hole extends through the black matrix layer to expose the encapsulation layer. The oleophobic layer covers the black matrix layer.

14 Claims, 3 Drawing Sheets

(51) Int. Cl.
     *C09D 101/28*    (2006.01)
     *C09D 133/26*    (2006.01)
     *C09D 139/02*    (2006.01)
     *C09D 147/00*    (2006.01)
     *H10K 50/84*     (2023.01)
     *H10K 50/86*     (2023.01)
     *H10K 71/00*     (2023.01)
     *C08K 5/098*     (2006.01)

(52) U.S. Cl.
     CPC ......... *C09D 133/26* (2013.01); *C09D 139/02* (2013.01); *C09D 147/00* (2013.01); *H10K 50/841* (2023.02); *H10K 50/865* (2023.02); *H10K 71/00* (2023.02); *C08K 5/098* (2013.01)

(56) References Cited

FOREIGN PATENT DOCUMENTS

| | | | |
|---|---|---|---|
| CN | 108919550 | A | 11/2018 |
| CN | 110048029 | A | 7/2019 |
| CN | 110246872 | A | 9/2019 |
| CN | 110459573 | A | 11/2019 |
| CN | 110928025 | A | 3/2020 |
| CN | 110970308 | A | 4/2020 |
| CN | 111146255 | A | 5/2020 |
| JP | 2006184535 | A | 7/2006 |
| JP | 2010286615 | A * | 12/2010 |

\* cited by examiner

DISPLAY PANEL AND MANUFACTURING METHOD THEREOF

FIELD OF DISCLOSURE

The present disclosure relates to the field of display technologies, in particular to a display panel and a manufacturing method thereof.

BACKGROUND

Because a polarizer has disadvantages of low transmittance, large thickness, brittle material, and high price, it greatly limits applications of flexible organic light emitting diode (OLED) display technologies. Therefore, a method of forming a color filter on a thin film encapsulation instead of circular polarizers is proposed. The color filter on the thin film encapsulation is usually prepared by an inkjet printing technology. The color filter prepared by the inkjet printing technology has a simple process, no photolithography mask is required in the production process, and a material utilization rate is high. However, when photoresist droplets are printed into pixel pits, a contact angle between an ink and a black matrix layer is too small, this makes it impossible to performer the printing.

SUMMARY OF DISCLOSURE

The present disclosure provides a display panel and a manufacturing method thereof to solve the problem that printing cannot be performed due to a small contact angle between an ink and a black matrix layer.

The present disclosure provides a display panel, including:
- a substrate;
- an encapsulation layer disposed on a surface of the substrate;
- a black matrix layer disposed on the encapsulation layer, where the black matrix layer includes a through hole, and the through hole extends through the black matrix layer to expose the encapsulation layer;
- an oleophobic layer covering the black matrix layer; and
- a color filter disposed within the through hole.

In the display panel of the present disclosure, an upper surface of the black matrix layer includes a microstructure.

In the display panel of the present disclosure, a surface of the black matrix layer is provided with a polar anionic group, the oleophobic layer includes a first compound and a second compound, the first compound includes an organic cationic polymer, the second compound includes a hydrophobic anionic compound, the first compound is adsorbed on the polar anionic group, and the second compound is adsorbed on the first compound.

In the display panel of the present disclosure, a molecular weight of the organic cationic polymer ranges from 10,000 to 1,000,000.

In the display panel of the present disclosure, the polar anionic group is selected from a group consisting of COO—, O—, and CO—.

In the display panel of the present disclosure, the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt.

In the display panel of the present disclosure, a structural formula of the hydrophobic anionic compound is $C_nX_{2n-1}O_2Y$, where n is greater than or equal to 6, X is a halogen element, and Y is an alkali metal.

The present disclosure also provides a display panel, including:
- a substrate;
- an encapsulation layer disposed on a surface of the substrate;
- a black matrix layer disposed on the encapsulation layer, where the black matrix layer includes a through hole, and the through hole extends through the black matrix layer to expose the encapsulation layer; and
- an oleophobic layer covering the black matrix layer.

In the display panel of the present disclosure, an upper surface of the black matrix layer includes a microstructure.

In the display panel of the present disclosure, a surface of the black matrix layer is provided with a polar anionic group, the oleophobic layer includes a first compound and a second compound, the first compound includes an organic cationic polymer, the second compound includes a hydrophobic anionic compound, the first compound is adsorbed on the polar anionic group, and the second compound is adsorbed on the first compound.

In the display panel of the present disclosure, the polar anionic group is selected from a group consisting of COO—, O—, and CO—.

In the display panel of the present disclosure, the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt.

In the display panel of the present disclosure, a structural formula of the hydrophobic anionic compound is $C_nX_{2n-1}O_2Y$, where n is greater than or equal to 6, X is a halogen element, and Y is an alkali metal.

The present disclosure also provides a manufacturing method of a display panel, including:
- providing a substrate;
- forming an encapsulation layer on the substrate;
- forming a black matrix layer on the encapsulation layer, where the black matrix layer includes a through hole, and the through hole extends through the black matrix layer to expose the encapsulation layer; and
- forming an oleophobic layer on a surface of the black matrix layer, including:
  - forming a polar anionic group on the surface of the black matrix layer to form a first intermediate product;
  - placing the first intermediate product in an aqueous solution including a first compound such that the first compound is adsorbed on the polar anionic group on the surface of the black matrix layer to form a second intermediate product, where the first compound includes an organic cationic polymer; and
  - placing the second intermediate product in an aqueous solution including a second compound such that the second compound is adsorbed on the first compound, and the first compound and the second compound together form the oleophobic layer, where the second compound includes a hydrophobic anionic compound.

In the manufacturing method of the display panel of the present disclosure, in a step of placing the first intermediate product in the aqueous solution including the first compound such that the first compound is adsorbed on the polar anionic group on the surface of the black matrix layer to form the second intermediate product, the method further includes:

after placing the first intermediate product in the aqueous solution including the first compound such that the first compound is adsorbed on the polar anionic group on the surface of the black matrix layer, placing the first intermediate product in a mixed solution of ethyl alcohol and water to form the second intermediate product.

In the manufacturing method of the display panel of the present disclosure, in a step of placing the second intermediate product in the aqueous solution including the second compound such that the second compound is adsorbed on the first compound, and the first compound and the second compound together form the oleophobic layer, the method further includes:

after placing the second intermediate product in the aqueous solution including the second compound such that the second compound is adsorbed on the first compound, placing the second intermediate product in anhydrous ethyl alcohol to form the oleophobic layer.

In the manufacturing method of the display panel of the present disclosure, a mass fraction of the first compound in the aqueous solution ranges from 0.1% to 40%, and a mass fraction of the second compound in the aqueous solution ranges from 5% to 50%.

The present disclosure provides a display panel and a manufacturing method thereof. An oleophobic layer is disposed on a black matrix layer, so a contact angle between a photoresist droplet and an interface of a through hole is increased. Thus, during a printing process, inks effectively flow into the through hole to form a uniform film.

BRIEF DESCRIPTION OF DRAWINGS

In order to more clearly describe the technical solutions of embodiments of the present disclosure, accompanying drawings to be used in the detailed description of the disclosure will be briefly described hereinbelow. Apparently, the drawings in the following description are only some embodiments of the present disclosure. For those skilled in the art, other drawings may be obtained based on these drawings without creative efforts.

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments of the present disclosure, all other embodiments obtained by those skilled in the art without creative efforts are within a scope of protection of the present disclosure.

Figure 1:
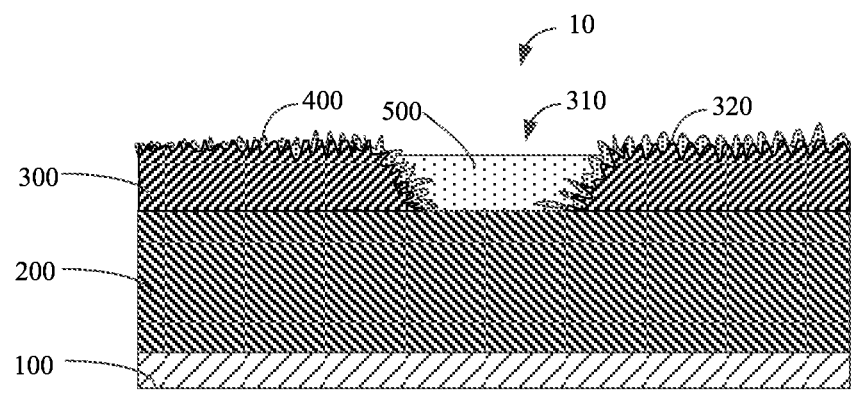
FIG. 1 is a cross-sectional view of a display panel of the present disclosure.

Please refer to FIG. 1, which is a cross-sectional view of a display panel of the present disclosure. The present disclosure provides a display panel 10. The display panel 10 includes a substrate 100, an encapsulation layer 200, a black matrix layer 300, and an oleophobic layer 400.

The substrate 100 includes a glass substrate, a resin substrate, a quartz substrate, and so on.

Figure 2:
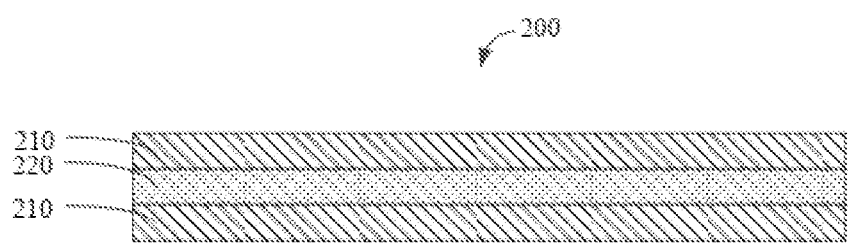
FIG. 2 is a cross-sectional view of an encapsulation layer of the present disclosure.

Please refer to FIG. 2, which is a cross-sectional view of an encapsulation layer of the present disclosure. The encapsulation layer 200 is disposed on the substrate 100. The encapsulation layer 200 is composed of a plurality of inorganic layers 210 and a plurality of organic layers 220. Each of the inorganic layers 210 and each of the organic layers 220 are arranged alternately and stacked on each other.

The black matrix layer 300 is disposed on the encapsulation layer 200. The black matrix layer 300 includes a through hole 310. The through hole 310 extends through the black matrix layer 300 to expose the encapsulation layer 200. An upper surface of the black matrix layer 300 includes a microstructure 320. The microstructure 320 on the surface of the black matrix layer 300 is provided with a polar anionic group. The polar anionic group is selected from a group consisting of COO—, O—, and CO—.

The oleophobic layer 400 is disposed on the black matrix layer 300. The oleophobic layer 400 is made of a first compound and a second compound. The first compound includes an organic cationic polymer. The second compound includes a hydrophobic anionic compound. The first compound is adsorbed on the polar anionic group. The second compound is adsorbed on the first compound.

In another embodiments, the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt. A structural formula of the hydrophobic anionic compound is $C_nX_{2n-1}O_2Y$, where n is greater than or equal to 6, X is a halogen element, and Y is an alkali metal.

In another embodiments, the organic cationic polymer is selected from a group consisting of poly diallyl dimethyl ammonium chloride, poly hexadimethrine bromide, polyacrylamide, and poly hydroxyethyl cellulose ether quaternary ammonium salt. In an embodiment, the organic cationic polymer is poly diallyl dimethyl ammonium chloride. The hydrophobic anionic compound is selected from a group consisting of sodium perfluorooctanoate, sodium perfluorohexanoate, sodium perfluoroheptanoate, and sodium perfluorononanoate. In this embodiment, the hydrophobic anionic compound is sodium perfluorooctanoate.

In another embodiment, the display panel further includes a color filter 500. The color filter 500 is disposed within the through hole 310.

In the present disclosure, the oleophobic layer is disposed on the upper surface of the black matrix layer, and the oleophobic layer is formed by the organic cationic polymer absorbing the hydrophobic anionic compound. The perfluorinated group in the perfluorooctanoic acid is an oleophobic group, and the carboxyl is a hydrophilic group. The perfluorooctanoic acid is neutralized to form sodium perfluorooctanoate. Sodium salt is water soluble and can be dissolved in water. After the organic cationic polymer and anions of perfluorooctanoic acid together form the oleophobic layer through electrostatic adsorption, an anion group faces inward (i.e., the hydrophilic group faces inward) and the oleophobic group (i.e., the perfluorinated group) faces outward, so that a contact angle between the black matrix layer and photoresist droplets is increased, and the ink can be formed into a film in the through hole.

Figure 3:
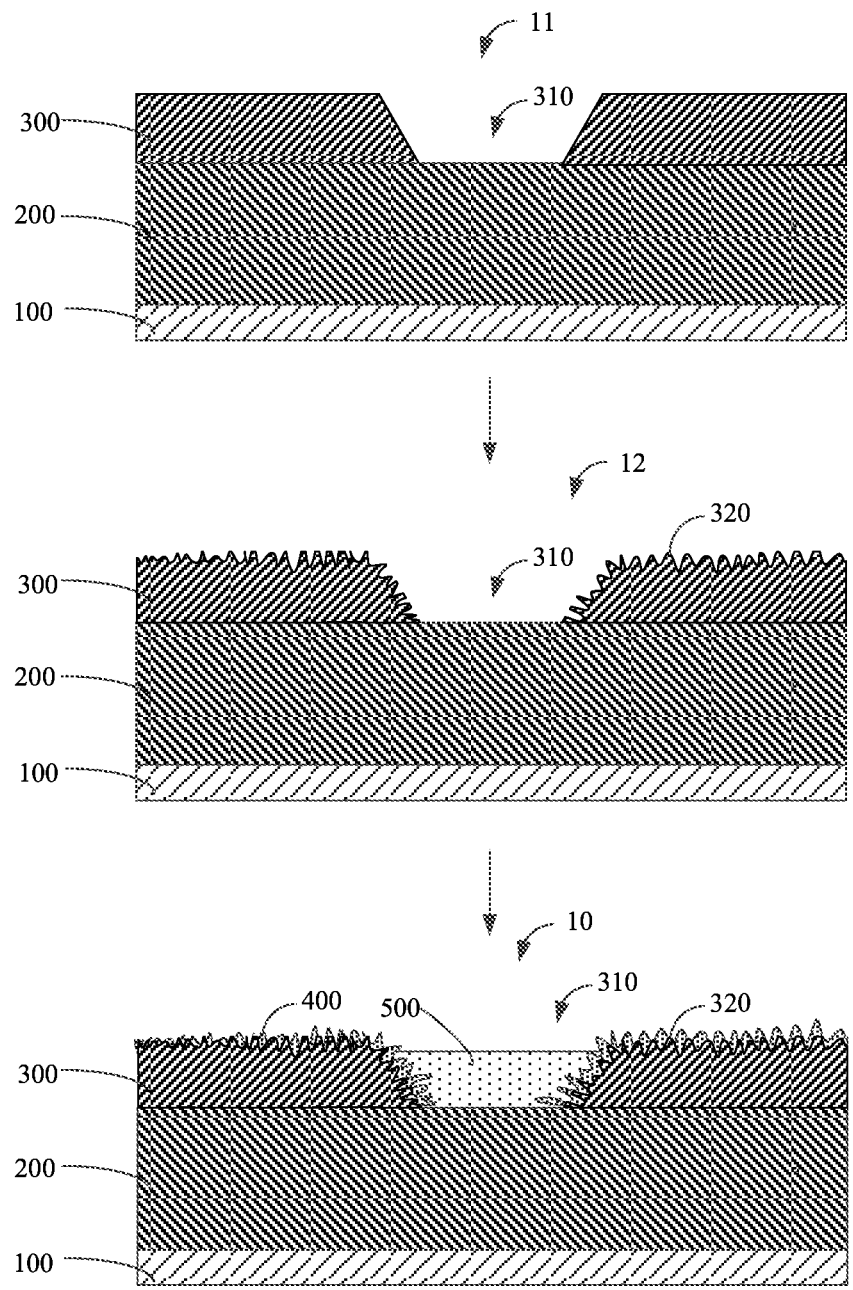
FIG. 3 is a plurality of cross-sectional views showing a flow of a manufacturing method of the display panel of the present disclosure.
Figure 4:
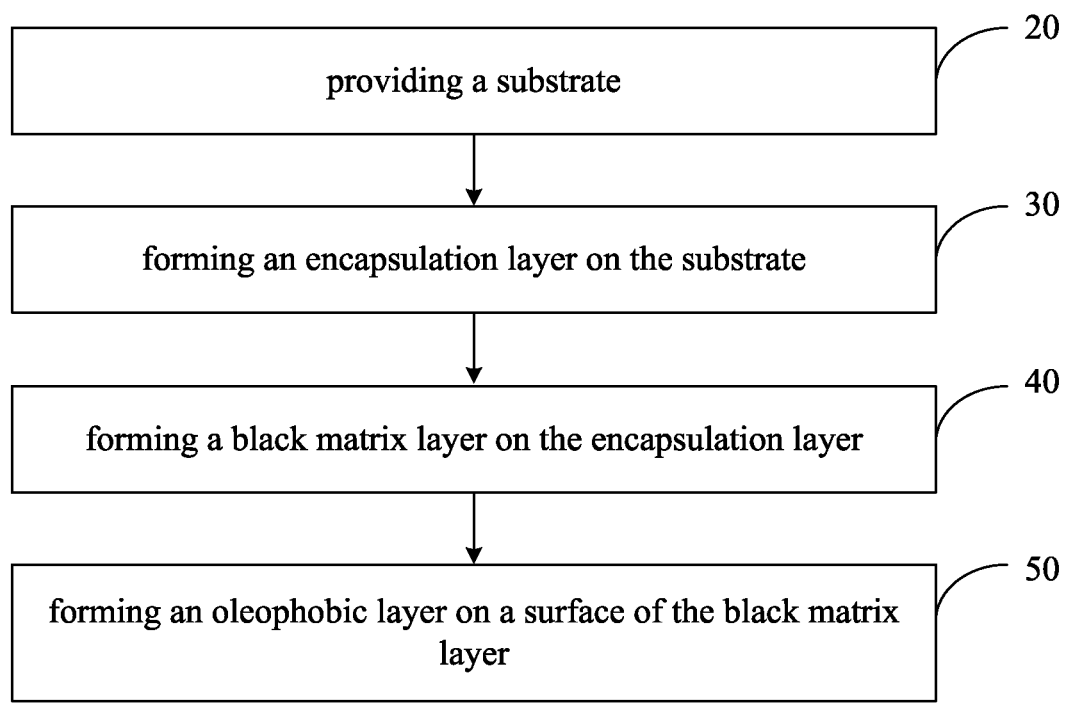
FIG. 4 is a flowchart of the manufacturing method of the display panel of the present disclosure.

Please refer to FIG. 3 and FIG. 4, FIG. 3 is a plurality of cross-sectional views showing a flow of a manufacturing method of the display panel of the present disclosure, and FIG. 4 is a flowchart of the manufacturing method of the display panel of the present disclosure. The present disclosure provides a manufacturing method of a display pane 110.

In a step 20, a substrate 100 is provided.

The substrate 100 includes a glass substrate, a resin substrate, a quartz substrate, etc.

In a step 30, an encapsulation layer 200 is formed on the substrate 100.

The encapsulation layer 200 is composed of a plurality of inorganic layers 210 and a plurality of organic layers 220. Each of the inorganic layers 210 and each of the organic layers 220 are arranged alternately and stacked on each other.

In a step 40, a black matrix layer 300 is formed on the encapsulation layer 200. The black matrix layer 300 includes a through hole 310, and the through hole 310 extends through the black matrix layer 300 to expose the encapsulation layer 200.

The black matrix layer 300 is formed on the encapsulation layer 200 by coating. Patterned black matrix layer 300 is formed by yellow light process. That is, the black matrix layer 300 is provided with the through hole 310. The through hole 310 extends through the black matrix layer 300 to expose the encapsulation layer 200. When the black matrix layer 300 is directly disposed on the encapsulation layer 200, the black matrix layer 300 needs to be processed through a low-temperature baking process.

In a step 50, an oleophobic layer 400 is formed on a surface of the black matrix layer 300.

Forming the oleophobic layer 400 on the surface of the black matrix layer 300 includes the following steps.

In a step 51, a polar anionic group is formed on the surface of the black matrix layer 300 to form a first intermediate product 11.

Specifically, the black matrix layer 300 is treated with a plasma process for 30 seconds to 120 seconds to form the first intermediate product 11. The first intermediate product is formed with an uneven microstructure 320. A surface of the microstructure 320 is provided with a polar anionic group. The polar anionic group is selected from a group consisting of COO—, O—, and CO—. Conditions of the plasma process are that: an atmosphere contains a plasma mixed gas of oxygen and argon, a power ranges from 30 W to 120 W, a flow rate of oxygen ranges from 2 sccm to 30 sccm, and a pressure ranges from 0 Pa to 133 Pa.

In a step 52, the first intermediate product 11 is placed in an aqueous solution including a first compound, and the first compound is adsorbed to the polar anionic group on the surface of the black matrix layer to form a second intermediate product 12. The first compound is an organic cationic polymer.

Specifically, the first intermediate product 11 is immersed in the aqueous solution including the first compound, and a mass fraction of the first compound in the aqueous solution ranges from 0.1% to 10%. An immersing time ranges from 10 seconds to 120 seconds. After immersing for 10 to 120 seconds, the first intermediate product 11 is immersed in a mixed solution of ethyl alcohol and water. A residual polymer in the second intermediate product 12 except on an upper surface of the black matrix layer 300 is washed away, so that the upper surface of the black matrix layer 300 adsorbs the organic cationic polymer with positive charges to form the second intermediate product 12. Because the upper surface of the black matrix layer 300 has a polar anionic group, the surface of the black matrix layer 300 is covered by polymer molecular chains with positive charges. The first compound is organic cationic polymer.

In another embodiment, the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt.

In another embodiment, the organic cationic polymer is selected from a group consisting of poly diallyl dimethyl ammonium chloride, poly hexadimethrine bromide, polyacrylamide, and poly hydroxyethyl cellulose ether quaternary ammonium salt. In an embodiment, the organic cationic polymer is poly diallyl dimethyl ammonium chloride.

In another embodiment, if a molecular weight of the organic cationic polymer ranges from 10,000 to 1,000,000, the mass fraction of the organic cationic polymer ranges from 0.4% to 40%.

In another embodiment, the aqueous solution including the first compound can be spin-coated or sprayed on the upper surface of the black matrix layer 300 of the second intermediate product 12 by a spin coating or spraying process.

In a step 53, the second intermediate product 12 is placed in an aqueous solution including a second compound, such that the second compound is adsorbed on the first compound. The first compound and the second compound together form the oleophobic layer 400. The second compound is a hydrophobic anionic compound.

Specifically, the second intermediate product 12 is immersed in the aqueous solution including the second compound, and a mass fraction of the second compound in the aqueous solution ranges from 5% to 50%. After immersing for 10 seconds to 120 seconds, the second intermediate product 12 is placed in anhydrous ethyl alcohol to clean its surface, and then the second intermediate product 12 is dries at 50 degrees Celsius for 30 minutes to form the oleophobic layer 400.

In another embodiment, a structural formula of the hydrophobic anionic compound is $C_nX_{2n-1}O_2Y$, where n≥6, X is a halogen element, and Y is an alkali metal.

In another embodiment, the hydrophobic anionic compound is selected from a group consisting of sodium perfluorooctanoate, sodium perfluorohexanoate, sodium perfluoroheptanoate, and sodium perfluorononanoate. In this embodiment, the hydrophobic anionic compound is sodium perfluorooctanoate.

In another embodiment, after the step of forming the oleophobic layer 400, the method further includes printing a color filter 500 on the through hole 310 by inkjet printing method. The display panel also includes the color filter 500. The color filter 500 is disposed within the through hole 310.

The present disclosure provides a display panel and a manufacturing method thereof. The oleophobic layer is formed on the black matrix layer by the electrostatic adsorption method, which increases the contact angle between the photoresist droplets and the interface of the through hole, so that the inks flow accurately into the through hole during the printing process without being adsorbed by a wall of the black matrix layer, and the inks are formed into an evenly film.

The above are only examples of the present disclosure, and do not limit the scope of the present disclosure. Any equivalent structure or equivalent process transformation made by the content of the specification and drawings of the present disclosure, or directly or indirectly used in other related technical fields, is similarly included in the scope of protection of the present disclosure.

What is claimed is:

1. A display panel, comprising:
   a substrate;
   an encapsulation layer disposed on a surface of the substrate;
   a black matrix layer disposed on the encapsulation layer, wherein the black matrix layer comprises a through hole, and the through hole extends through the black matrix layer to expose the encapsulation layer;
   an oleophobic layer covering the black matrix layer;
   wherein an upper surface of the black matrix layer comprises a microstructure, and a surface of the microstructure is provided with a polar anionic group.

2. The display panel as claimed in claim 1, wherein a surface of the black matrix layer is provided with a polar anionic group, the oleophobic layer comprises a first compound and a second compound, the first compound comprises an organic cationic polymer, the second compound comprises a hydrophobic anionic compound, the first compound is adsorbed on the polar anionic group, and the second compound is adsorbed on the first compound.

3. The display panel as claimed in claim 2, wherein a molecular weight of the organic cationic polymer ranges from 10,000 to 1,000,000.

4. The display panel as claimed in claim 2, wherein the polar anionic group is selected from a group consisting of COO—, O—, and CO—.

5. The display panel as claimed in claim 2, wherein the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt.

6. The display panel as claimed in claim 2, wherein a structural formula of the hydrophobic anionic compound is $CnX_{2n-1}O_2Y$, wherein n is greater than or equal to 6, X is a halogen element, and Y is an alkali metal.

7. A display panel, comprising:
   a substrate;
   an encapsulation layer disposed on a surface of the substrate;
   a black matrix layer disposed on the encapsulation layer, wherein the black matrix layer comprises a through hole, and the through hole extends through the black matrix layer to expose the encapsulation layer; and
   an oleophobic layer covering the black matrix layer;
   wherein a surface of the black matrix layer is provided with a polar anionic group, the oleophobic layer comprises a first compound and a second compound, the first compound comprises an organic cationic polymer, the second compound comprises a hydrophobic anionic compound, the first compound is adsorbed on the polar anionic group, and the second compound is adsorbed on the first compound.

8. The display panel as claimed in claim 7, wherein the polar anionic group is selected from a group consisting of COO—, O—, and CO—.

9. The display panel as claimed in claim 7, wherein the organic cationic polymer is selected from a group consisting of poly diallyl dimethyl ammonium halide, poly hexyl dimethyl ammonium halide, polyacrylamide, and poly hydroxyethyl cellulose ether quaternary ammonium salt.

10. The display panel as claimed in claim 7, wherein a structural formula of the hydrophobic anionic compound is $CnX_{2n-1}O_2Y$, wherein n is greater than or equal to 6, X is a halogen element, and Y is an alkali metal.

11. A manufacturing method of a display panel, comprising:
    providing a substrate;
    forming an encapsulation layer on the substrate;
    forming a black matrix layer on the encapsulation layer, wherein the black matrix layer comprises a through hole, and the through hole extends through the black matrix layer to expose the encapsulation layer; and
    forming an oleophobic layer on a surface of the black matrix layer, comprising: forming a polar anionic group on the surface of the black matrix layer to form a first intermediate product;
    placing the first intermediate product in an aqueous solution comprising a first compound such that the first compound is adsorbed on the polar anionic group on the surface of the black matrix layer to form a second intermediate product, wherein the first compound comprises an organic cationic polymer; and
    placing the second intermediate product in an aqueous solution comprising a second compound such that the second compound is adsorbed on the first compound, and the first compound and the second compound together form the oleophobic layer, wherein the second compound comprises a hydrophobic anionic compound.

12. The manufacturing method of the display panel as claimed in claim 11, wherein in a step of placing the first intermediate product in the aqueous solution comprising the first compound such that the first compound is adsorbed on the polar anionic group on the surface of the black matrix layer to form the second intermediate product, the method further comprises:
    after placing the first intermediate product in the aqueous solution comprising the first compound such that the first compound is adsorbed on the polar anionic group on the surface of the black matrix layer, placing the first intermediate product in a mixed solution of ethyl alcohol and water to form the second intermediate product.

13. The manufacturing method of the display panel as claimed in claim 11, wherein in a step of placing the second intermediate product in the aqueous solution comprising the second compound such that the second compound is adsorbed on the first compound, and the first compound and the second compound together form the oleophobic layer, the method further comprises:
    after placing the second intermediate product in the aqueous solution comprising the second compound such that the second compound is adsorbed on the first compound, placing the second intermediate product in anhydrous ethyl alcohol to form the oleophobic layer.

14. The manufacturing method of the display panel as claimed in claim 11, wherein a mass fraction of the first compound in the aqueous solution ranges from 0.1% to 40%, and a mass fraction of the second compound in the aqueous solution ranges from 5% to 50%.

* * * * *